United States Patent
Higuchi et al.

(10) Patent No.: US 7,821,100 B2
(45) Date of Patent: Oct. 26, 2010

(54) SEMICONDUCTOR DEVICE AND METHOD FOR MANUFACTURING THE SAME

(75) Inventors: Yuichiro Higuchi, Toyama (JP); Keita Takahashi, Toyama (JP)

(73) Assignee: Panasonic Corporation, Osaka (JP)

( * ) Notice: Subject to any disclaimer, the term of this patent is extended or adjusted under 35 U.S.C. 154(b) by 192 days.

(21) Appl. No.: 12/194,915

(22) Filed: Aug. 20, 2008

(65) Prior Publication Data

US 2009/0078988 A1    Mar. 26, 2009

(30) Foreign Application Priority Data

Sep. 21, 2007   (JP) .............................. 2007-245928

(51) Int. Cl.
*H01L 29/00* (2006.01)
*H01L 27/10* (2006.01)

(52) U.S. Cl. ............... 257/529; 257/209; 257/E21.592; 257/E21.149

(58) Field of Classification Search ................. 257/209, 257/529
See application file for complete search history.

(56) References Cited

U.S. PATENT DOCUMENTS

| | | | | |
|---|---|---|---|---|
| 3,792,319 A * | 2/1974 | Tsang | ......................... | 257/529 |
| 4,412,241 A * | 10/1983 | Nelson | ....................... | 257/529 |
| 4,517,583 A * | 5/1985 | Uchida | ......................... | 257/67 |
| 4,518,981 A * | 5/1985 | Schlupp | ...................... | 257/476 |
| 4,679,310 A * | 7/1987 | Ramachandra et al. | ...... | 438/570 |
| 4,862,243 A * | 8/1989 | Welch et al. | .................. | 257/529 |
| 5,376,820 A * | 12/1994 | Crafts et al. | ................. | 257/529 |
| 5,914,524 A * | 6/1999 | Komenaka | ................... | 257/529 |
| 5,949,127 A * | 9/1999 | Lien et al. | .................... | 257/529 |
| 6,117,714 A | 9/2000 | Beatty | | |
| 6,266,290 B1 * | 7/2001 | Sredanovic et al. | ...... | 365/225.7 |
| 6,337,502 B1 | 1/2002 | Eitan et al. | | |
| 6,365,938 B2 | 4/2002 | Lee et al. | | |
| 6,537,883 B2 | 3/2003 | Chen et al. | | |
| 6,551,864 B2 * | 4/2003 | Marr et al. | ................... | 438/132 |
| 2001/0017755 A1 * | 8/2001 | Toyoshima | ................... | 361/56 |
| 2001/0026970 A1 | 10/2001 | Eitan et al. | | |
| 2002/0027248 A1 * | 3/2002 | Aipperspach et al. | ....... | 257/350 |
| 2003/0045087 A1 * | 3/2003 | Yoshie et al. | ............... | 438/622 |
| 2004/0070049 A1 * | 4/2004 | Anderson et al. | ........... | 257/529 |
| 2006/0118904 A1 * | 6/2006 | Liaw | .......................... | 257/529 |
| 2007/0152265 A1 | 7/2007 | Moriyama et al. | | |
| 2007/0273002 A1 * | 11/2007 | Hwang | ....................... | 257/529 |
| 2009/0174029 A1 * | 7/2009 | Ueda | .......................... | 257/529 |

FOREIGN PATENT DOCUMENTS

JP    2001-0057389    2/2001

* cited by examiner

*Primary Examiner*—Jerome Jackson, Jr.
*Assistant Examiner*—Jose R Diaz
(74) *Attorney, Agent, or Firm*—McDermott Will & Emery LLP

(57) ABSTRACT

A semiconductor device includes a protection target element formed on a semiconductor substrate and includes a protection target element electrode, a substrate connecting part including a substrate connecting electrode electrically connected to the semiconductor substrate and a fuse structure provided between the protection target element electrode and the substrate connecting electrode and includes a fuse film configured to be torn by applying a predetermined current thereto. The protection target element electrode, the substrate connecting electrode and the fuse film are formed of an integral conductive film as long as the fuse film is not torn.

14 Claims, 9 Drawing Sheets

SEMICONDUCTOR DEVICE AND METHOD FOR MANUFACTURING THE SAME

CROSS-REFERENCE TO RELATED APPLICATION

This non-provisional application claims priority under 35 U.S.C. §119(a) of Japanese Patent Application No. 2007-245928 filed in Japan on Sep. 21, 2007, the entire contents of which are hereby incorporated by reference.

BACKGROUND OF THE INVENTION

1. Field of the Invention

The present invention relates to a semiconductor device and a method for manufacturing the same. In particular, it relates to a semiconductor device, such as a memory device which is disadvantageously affected by a charge-up phenomenon during a diffusion process, and a method for manufacturing the same.

2. Description of Related Art

In nonvolatile memories involving local charge accumulation, charges injected as a result of a charge-up phenomenon during a diffusion process are often difficult to remove after the completion of the diffusion process. For this reason, greater importance has been placed on a technology for suppressing charge-up damage to a memory element during the diffusion process. As an example of a method for suppressing the charge-up damage, Publication of Japanese Patent Application No. 2001-57389 discloses a method for connecting a protective element to the memory element during the diffusion process.

FIG. 14 shows a conventional method for suppressing the charge-up damage. As shown in FIG. 14, a charge-up protection transistor 152 is connected to a protection target element 150 through a wiring line 140 in a wiring process. Accordingly, when a positive charge is applied to an electrode of the protection target element 150 in a process to be performed after the wiring process, a positive voltage is simultaneously applied to an electrode of the protection transistor 152. Then, the protection transistor 152 is brought into electrical conduction and the charge is not stored in the electrode of the protection target element 150 but transferred to a substrate 141. When a negative charge is applied to the protection target element 150, a source/drain diffusion layer and a well diffusion layer of the protection transistor 152 are forward-biased. As a result, the charge is not stored in the electrode of the protection target element 150 but transferred to the substrate 141.

According to the aforementioned conventional technique, however, the protection effect is achieved only after the wiring process. Therefore, the memory element cannot be protected from a charge-up phenomenon caused during a diffusion process on a Front End of Line (FEOL) level. Further, a negative bias cannot be applied to the protection target element after the diffusion process.

As the memory element becomes finer, the charge-up phenomenon during the diffusion process on the FEOL level has having nonegligible effect on variations of initial threshold value (Vt) of memory cells. Specifically, since low-temperature processes are required under the fine design rules, a heating process for withdrawing charges stored on the FEOL level cannot be performed. As a result, the charge-up damage is not suppressed to a sufficient degree by measures taken to protect the memory element in the processes after the wiring process.

When the thickness of an oxide-nitride-oxide film (ONO film) is reduced according to the finer design rules, an initial threshold value Vt is likely to be varied by charge injection. For example, when the thickness of the ONO film is reduced from 30 nm to 15 nm, the initial threshold value Vt may possibly vary due to the charge injection only as a result of applying a voltage of about 10 V for a long time during charging in the diffusion process on the FEOL level.

SUMMARY OF THE INVENTION

An object of the present invention is to provide, as a solution to the above-described conventional problem, a semiconductor device capable of protecting a protection target element from a charge-up phenomenon during a diffusion process on the FEOL level even at low positive and negative voltages and applying high positive and negative voltages required for driving the protection target element to the protection target element after the completion of the diffusion process.

In order to achieve the object, a semiconductor device of the present invention has been devised in which a semiconductor substrate is electrically connected to a fuse film and a substrate connecting electrode integrated with a protection target element electrode.

Specifically, the semiconductor device of the present invention includes: a protection target element formed on a semiconductor substrate and includes a protection target element electrode; a substrate connecting part including a substrate connecting electrode electrically connected to the semiconductor substrate; and a fuse structure provided between the protection target element electrode and the substrate connecting electrode and includes a fuse film configured to be torn by applying a predetermined current thereto. The protection target element electrode, the substrate connecting electrode and the fuse film are formed of an integral conductive film as long as the fuse film is not torn.

The semiconductor device of the present invention makes it possible to avoid the occurrence of charge-up damage to the protection target element from a point of time when the conductive film serving as the protection target element electrode is formed. The fuse film is configured to be torn by applying a predetermined current thereto. The tearing of the fuse film after the diffusion process makes it possible to apply high positive and negative voltages required for driving the protection target element.

A method for manufacturing the semiconductor device of the present invention includes the steps of: (a) forming an insulating film on a first conductivity type semiconductor substrate; (b) forming a first opening in the insulating film and forming on the insulating film a second conductivity type conductive film electrically connected to the semiconductor substrate through the first opening; (c) forming a protection target element on part of the semiconductor substrate spaced from the first opening, the protection target element using part of the conductive film as an electrode; and (d) tearing the conductive film at part thereof between the first opening and the protection target element after the step (c).

According to the method for manufacturing the semiconductor device of the present invention, the protection target element is protected from charge-up damage from a point of time when the electrode of the protection target element is formed. After the completion of the diffusion process, high

BRIEF DESCRIPTION OF THE DRAWINGS

FIG. 2A shows the state where a fuse film is not torn yet and FIG. 2B shows the state after the fuse film is torn.

DETAILED DESCRIPTION OF THE INVENTION

Embodiment 1

Figure 1:
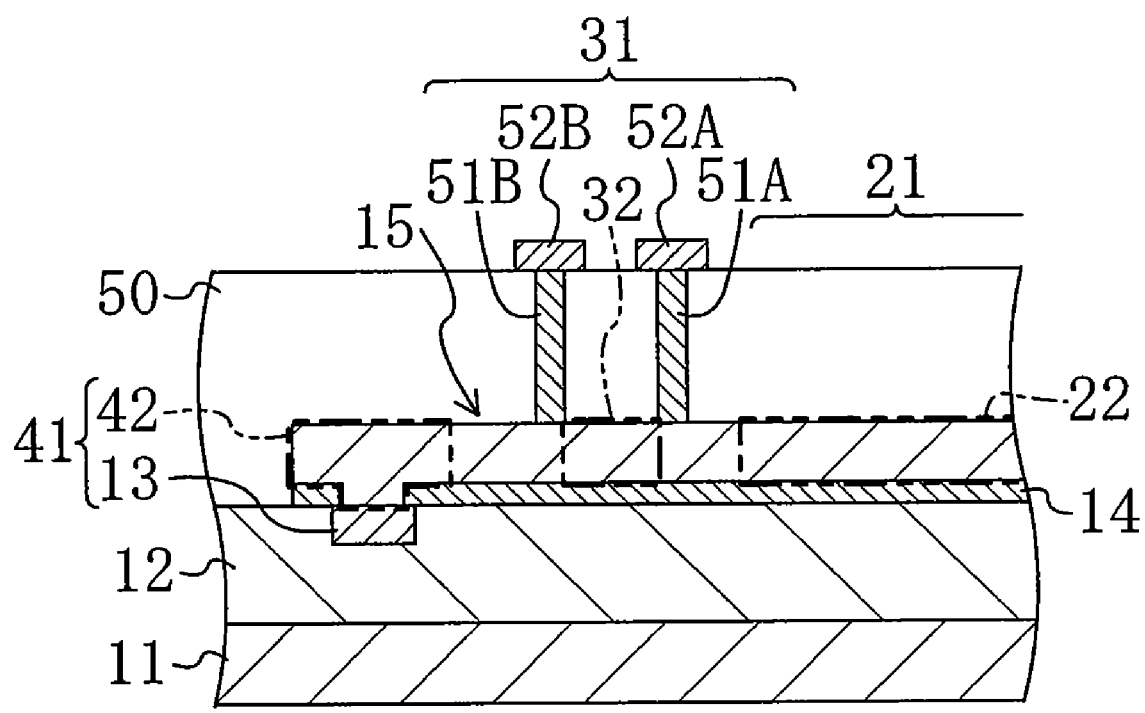
FIG. 1 is a sectional view illustrating a semiconductor device according to Embodiment 1 of the present invention.

Embodiment 1 of the present invention is described below with reference to the drawings. FIG. 1 shows a sectional structure of a semiconductor device of Embodiment 1. As shown in FIG. 1, the semiconductor device of the present embodiment includes a protection target element 21, a fuse structure 31 and a substrate connecting part 41.

The protection target element 21 is, for example, a nonvolatile memory formed on a first conductivity type semiconductor substrate 11 made of silicon (Si). In FIG. 1, only part of the protection target element 21 is shown, i.e., a protection target element electrode 22. The protection target element electrode 22 may be, for example, a gate electrode of a memory element. The fuse structure 31 has a fuse film 32 which is configured to be torn by applying a current thereto. The substrate connecting part 41 includes a substrate connecting electrode 42 connected to the semiconductor substrate 11.

The protection target element electrode 22, the fuse film 32 and the substrate connecting electrode 42 are formed of an integral conductive film 15 provided on a first conductivity type well 12 in the semiconductor substrate 11 with an insulating film 14 interposed therebetween. The conductive film 15 may be, for example, a polysilicon film doped with second conductivity type impurities.

An opening is formed in part of the insulating film 14 corresponding to the substrate connecting electrode 42. The substrate connecting electrode 42 is electrically connected to the semiconductor substrate 11 through the opening. A first conductivity type diffusion layer 13 is formed in part of the semiconductor substrate 11 in contact with the substrate connecting electrode 42.

The fuse film 32 is formed between the protection target element electrode 22 and the substrate connecting electrode 42. A first disconnecting terminal 52A and a second disconnecting terminal 52B are electrically connected to parts of the conductive film 15 at the ends of the fuse film 32, respectively. The first disconnecting terminal 52A and the second disconnecting terminal 52B are connected to the conductive film 15 with the interposition of a first wiring line 51A and a second wiring line 51B formed in a wiring layer 50 formed on the semiconductor substrate 11, respectively. The fuse film 32 is configured to be torn by allowing a current to flow between the first disconnecting terminal 52A and the second disconnecting terminal 52B. In this configuration, the second disconnecting terminal 52B is connected to the conductive film 15. However, the second disconnecting terminal 52B may directly be connected, for example, to the well 12, as long as the current is applied to the fuse film 32.

Figure 2A:
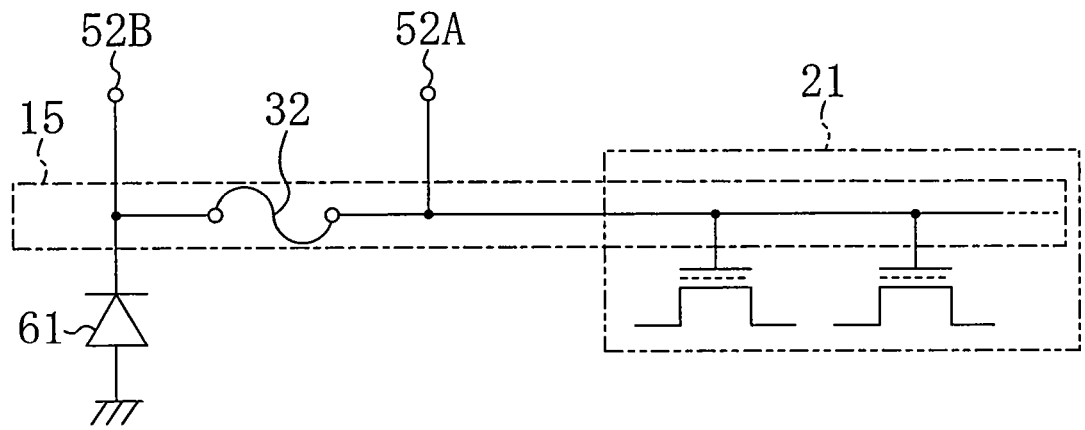
FIGS. 2A and 2B show an equivalent circuit diagram of the semiconductor device according to Embodiment 1 of the present invention.
Figure 2B:
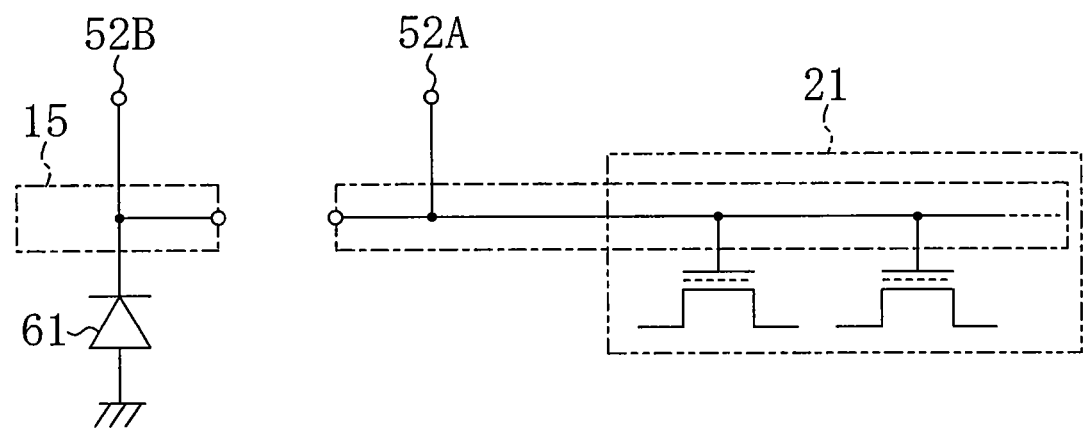

FIGS. 2A and 2B show an equivalent circuit diagram of the semiconductor device according to Embodiment 1 shown in FIG. 1. Specifically, FIG. 2A shows the state where the fuse film 32 is not torn yet and FIG. 2B shows the circuit after the fuse film 32 is torn. The protection target element 21 is depicted as a nonvolatile memory element array.

When a positive charge-up phenomenon occurs during a diffusion process, a positive voltage is applied to the conductive film 15 shown in FIG. 2A. When the conductive film 15 has a second conductivity, a pn junction diode 61 is formed by the substrate connecting electrode 42 and the first conductivity type diffusion layer 13. In the case of the positive charge-up phenomenon, the pn junction diode 61 is reverse-biased. However, when impurities of about $6 \times 15$ cm$^{-2}$ and $2 \times 15$ cm$^{-2}$ are applied to the conductive film 15 and the first conductivity type diffusion layer 13, respectively, the pn junction diode 61 has a withstand voltage of about 1 V. As a result, the charge is transferred to the first conductivity type well 12 or the first conductivity type semiconductor substrate 11, thereby suppressing charge-up damage to the protection target element 21.

As the protection target element electrode 22, the fuse film 32 and the substrate connecting electrode 42 are made of the single conductive film 15, they have a potential difference of approximately 0 V. Further, since the withstand voltage of the pn junction diode 61 formed in the substrate connecting part is controlled to about 1 V, a positive charge-up phenomenon of about 1 V is less likely to occur during a diffusion process on the FEOL level.

When a negative charge-up phenomenon occurs during the diffusion process, a negative voltage is applied to the conductive film 15. As a result, the pn junction diode 61 is forward-biased. Accordingly, the charge is transferred to the first conductivity type well 12 or the first conductivity type semiconductor substrate 11, thereby suppressing charge-up damage to the protection target element 21.

As the protection target element electrode 22, the fuse film 32 and the substrate connecting electrode 42 are made of the single conductive film 15, they have a potential difference of approximately 0 V. If potential barrier in the forward bias direction of the pn junction diode 61 formed in the substrate connecting part is adjusted to about 0.7 V, a negative charge-up phenomenon of about −1 V is less likely occur during the diffusion process on the FEOL level. When impurities of about $6\times10^{15}$ cm$^{-2}$ and $2\times10^{15}$ cm$^{-2}$ are applied to the conductive film 15 and the first conductivity type diffusion layer 13, respectively, the potential barrier is controlled to about 0.7 V.

Further, after the completion of the diffusion process, the fuse film 32 is torn by allowing a current to flow between the first disconnecting terminal 52A and the second disconnecting terminal 52B as shown in FIG. 2B. This makes it possible to apply the required high positive and negative voltages to the protection target element 21.

Figure 3:
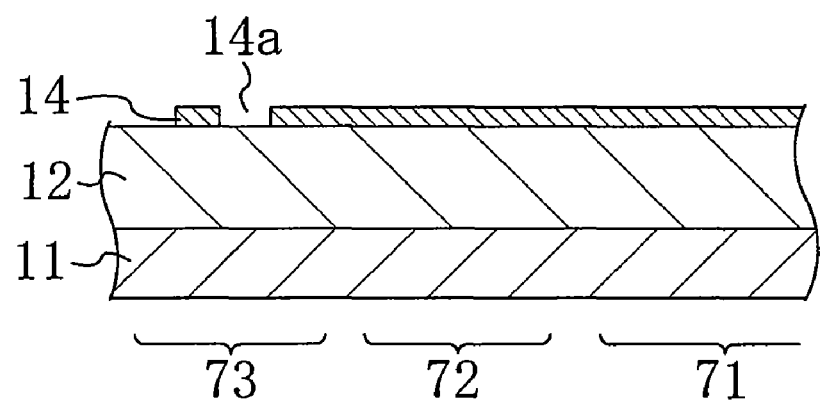
FIG. 3 is a sectional view illustrating a step of a method for manufacturing the semiconductor device according to Embodiment 1 of the present invention.

Hereinafter, a method for manufacturing the semiconductor device of Embodiment 1 is described with reference to the drawings. First, as shown in FIG. 3, a first conductivity type well 12 is formed in a first conductivity type semiconductor substrate 11. An insulating film 14 is formed on the well 12 to cover a protection target element region 71, a fuse structure region 72 and a substrate connecting part region 73. Then, an opening 14a is formed in part of the insulating film 14 in the substrate connecting part region 73. The insulating film 14 may be about 2 nm to 30 nm in thickness. The insulating film 14 may be formed integrally with or separately from another insulating film formed on the protection target element region 71.

Figure 4:
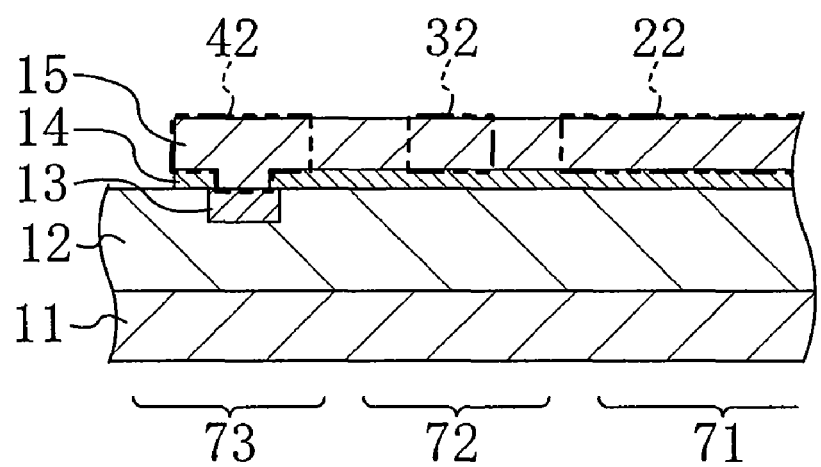
FIG. 4 is a sectional view illustrating a step of the method for manufacturing the semiconductor device according to Embodiment 1 of the present invention.

Then, as shown in FIG. 4, first conductivity type impurities are implanted in part of the well 12 exposed in the opening 14a to form a first conductivity type diffusion layer 13. The impurity implantation may be performed at a concentration of, for example, $2\times10^{15}$ cm$^{-2}$. Then, a conductive film 15 is formed on the insulating film 14 to fill the opening 14a and second conductivity type impurities are implanted in the conductive film 15. The impurity implantation may be performed at a concentration of, for example, $6\times10^{15}$ cm$^{-2}$. Part of the conductive film 15 corresponding to the protection target element region 71 serves as a protection target element electrode 22, part of the conductive film 15 corresponding to the fuse structure region 72 serves as a fuse film 32 and part of the conductive film 15 corresponding to the substrate connecting part region 73 serves as a substrate connecting electrode 42. From this point of time, a protection target element electrode 22 of the protection target element and a gate insulating film (not shown) are protected from a charge-up phenomenon.

The impurity concentration of the first conductivity type diffusion layer 13 and the conductive film 15 may optionally be selected in consideration of, for example, a charge-up voltage at which the protection is achieved. The first conductivity type diffusion layer 13 may be formed if needed, as long as a pn junction diode having an appropriate withstand voltage is formed between the substrate connecting electrode 42 and the semiconductor substrate 11.

The part of the conductive film 15 corresponding to the fuse structure region 72 may be formed narrower than the other parts of the conductive film 15 so that the fuse film 32 is easily torn. The narrowing may be may be achieved by lithography and ion milling such as Reactive Ion Etching (RIE), Focused Ion Beam (FIB) or other techniques.

For improved conductivity, the conductive film 15 may be metal silicide. In this case, part of the conductive film 15 corresponding to the fuse structure region 72 is not silicided to increase the resistance, so that the fuse film 32 is easily torn.

Further, an insulating film as thin as 4 nm or less made of a natural oxide film or a chemical oxide film may be formed at the interface between the substrate connecting electrode 42 and the first conductivity type diffusion layer 13. With such a small thickness, the insulating film allows a sufficient tunnel current to flow or the insulating film is broken when charging occurs during a manufacturing step, thereby bringing the substrate connecting electrode 42 and the semiconductor substrate 11 into electrical connection. Therefore, the insulating film does not cause any operational problem.

Figure 5:
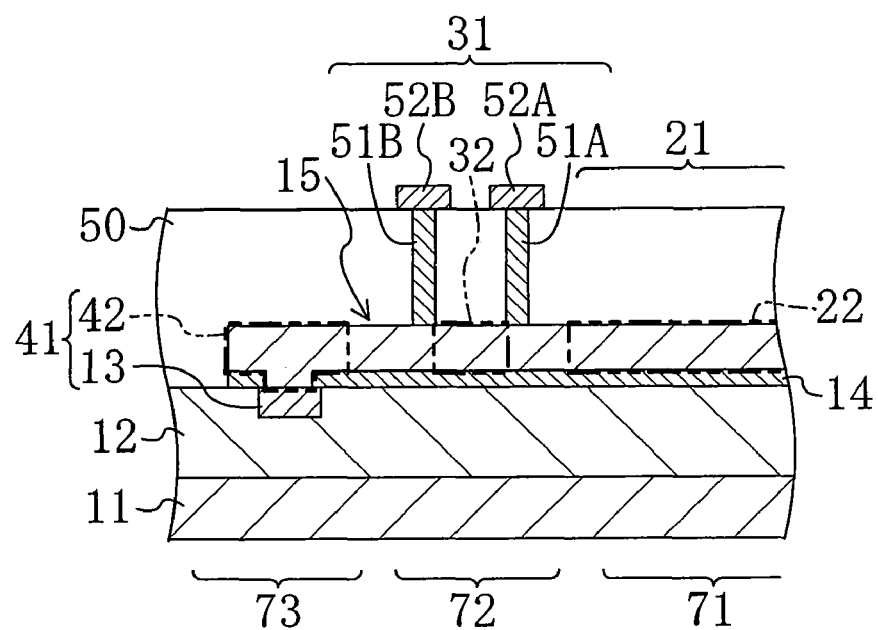
FIG. 5 is a sectional view illustrating a step of the method for manufacturing the semiconductor device according to Embodiment 1 of the present invention.

Then, after the process of finishing the protection target element including the diffusion process and other processes, a wiring layer 50 is formed as shown in FIG. 5. Then, a first wiring line 51A and a first disconnecting terminal 52A electrically connected to one of the sides of the fuse film 32 of the conductive film 15 are formed, while a second wiring line 51B and a second disconnecting terminal 52B electrically connected to the other side of the fuse film 32 are formed. The process of finishing the protection target element may be performed simultaneously with the process of forming the wiring layer 50, or a process of forming the first wiring line 51A, the first disconnecting terminal 52A, the second wiring line 51B and the second disconnecting terminal 52B.

Figure 6:
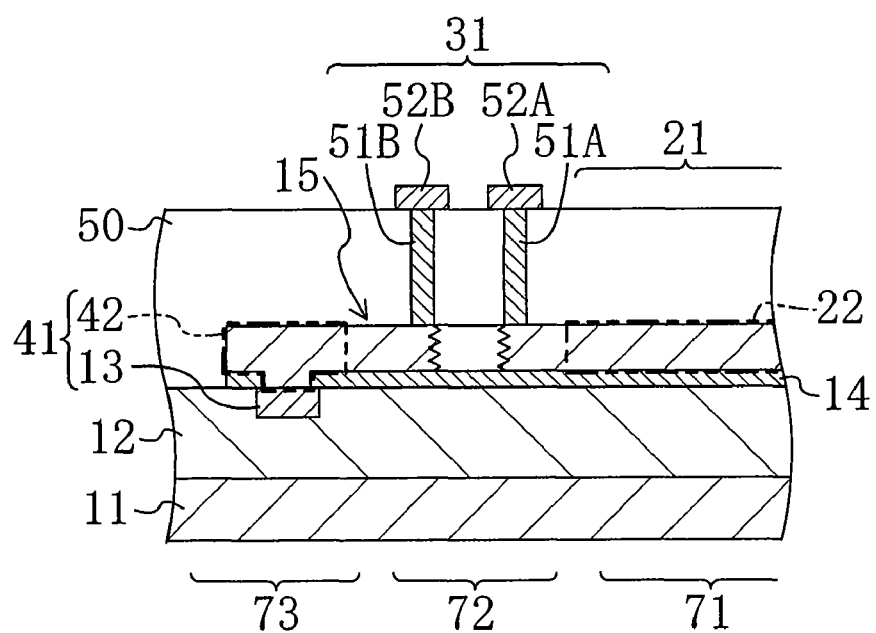
FIG. 6 is a sectional view illustrating a step of the method for manufacturing the semiconductor device according to Embodiment 1 of the present invention.

Then, as shown in FIG. 6, in an inspection process after the diffusion process, a current is allowed to flow between the first disconnecting terminal 52A and the second disconnecting terminal 52B to tear the fuse film 32. As a result, the protection target element electrode 22 and the substrate connecting electrode 42 are insulated from each other. For example, if the fuse film 32 is made of polysilicon doped with impurities of $6\times10^{15}$ cm$^{-2}$ and has a thickness of 0.2 μm, a width of 0.12 μm, a length of 0.96 μm and a sheet resistance of 130Ω/□, a current having a current density of 200 mA/μm$^2$ is applied to the fuse film 32 for about 1 msec, thereby tearing the fuse film 32.

Figure 7:
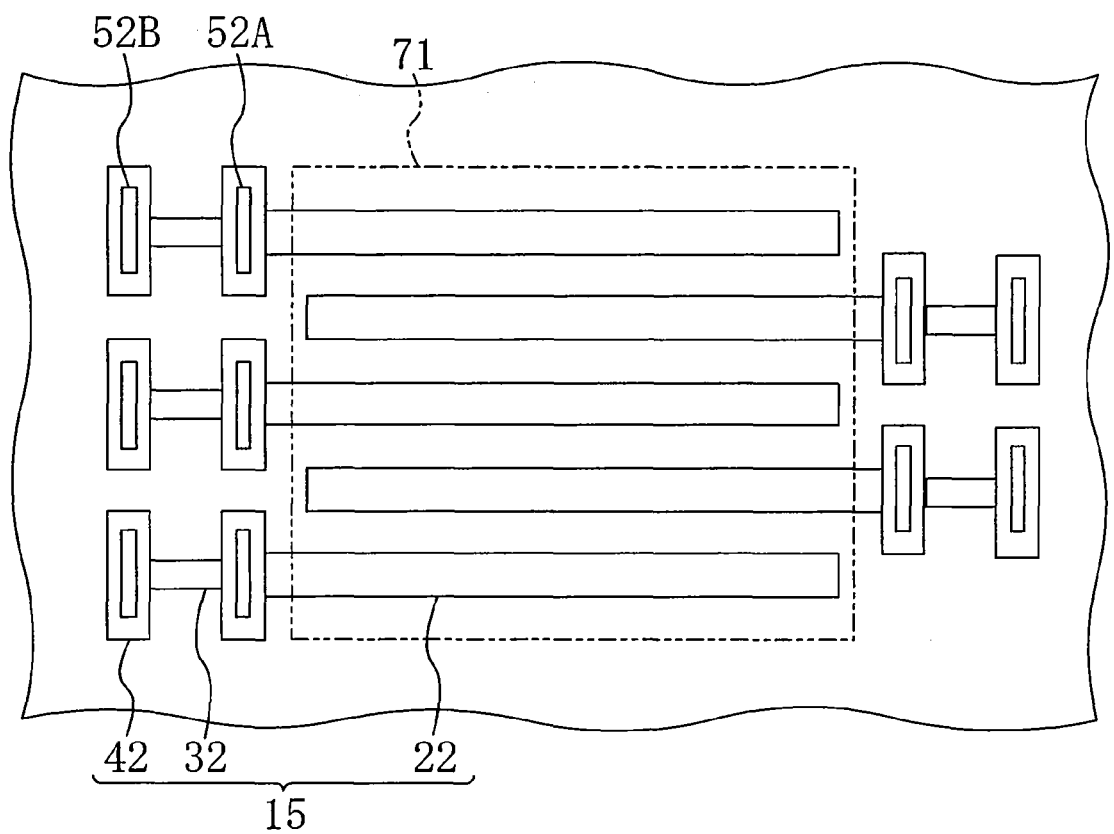
FIG. 7 is a plan view illustrating an example of a layout of the semiconductor device according to Embodiment 1 of the present invention.

As shown in FIG. 7, if a plurality of protection target element electrodes 22 are formed, a plurality of the conductive films 15 are arranged in parallel. In this case, for example, the fuse film 32 and the substrate connecting electrode 42 of one conductive film are formed on one of the sides of the corresponding protection target element electrode 22, while the fuse film 32 and the substrate connecting electrode 42 of another conductive film adjacent to said conductive film are formed on the other side of the corresponding protection target element electrode 22. In this configuration, even if parts of the conductive film 15 at the sides of the fuse film 32 are enlarged to keep a margin for connecting the first wiring line 51A and the second wiring line 51B, there is no need of increasing the intervals between the protection target elements. Therefore, size reduction of the device is realized.

As described above, the semiconductor device and the method for manufacturing the same according to the present embodiment make it possible to protect the protection target element even on the FEOL level. Thus, high positive and negative voltages can be applied to the protection target element after the completion of the diffusion process.

Embodiment 2

Figure 8:
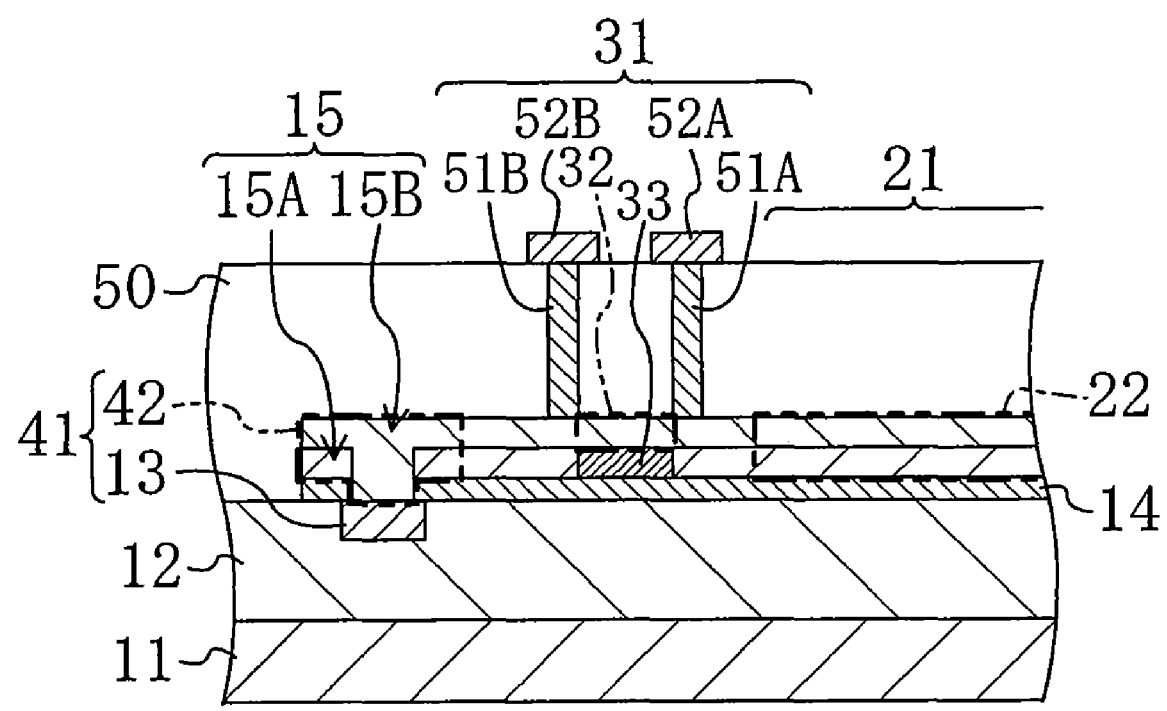
FIG. 8 is a sectional view illustrating a semiconductor device according to Embodiment 2 of the present invention.

Embodiment 2 of the present invention is described with reference to the drawings. FIG. 8 shows a sectional structure of a semiconductor device of Embodiment 2. In FIG. 8, like reference numerals are used to refer to like elements shown in FIG. 1 so as to avoid repetition of the description.

In the semiconductor device of Embodiment 2, a conductive film 15 includes a lower conductive film 15A and an upper conductive film 15B. A fuse film 32 does not include the lower conductive film 15A but is made of only the upper conductive film 15B formed on a fuse insulating film 33.

According to the semiconductor device of Embodiment 2, part of the conductive film corresponding to the fuse film 32 is reduced in thickness to increase the resistance.

Therefore, as compared with the semiconductor device of Embodiment 1, the fuse film 32 is torn more easily.

Figure 9:
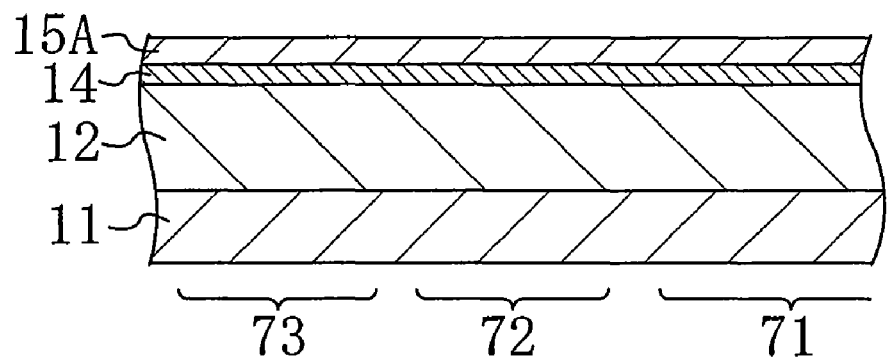
FIG. 9 is a sectional view illustrating a step of a method for manufacturing the semiconductor device according to Embodiment 2 of the present invention.

Hereinafter, a method for manufacturing the semiconductor device of Embodiment 2 is described with reference to the drawings. First, as shown in FIG. 9, a first conductivity type well 12 is formed in a first conductivity type semiconductor substrate 11. An insulating film 14 made of $SiO_2$ or other material and a lower conductive film 15A made of polysilicon or other material are formed on the well 12. The insulating film 14 may be about 2 nm to 30 nm in thickness and the lower conductive film 15A may be about 5 nm to 80 nm. The insulating film 14 may be formed integrally with or separately from another insulating film formed in a protection target element.

Figure 10:
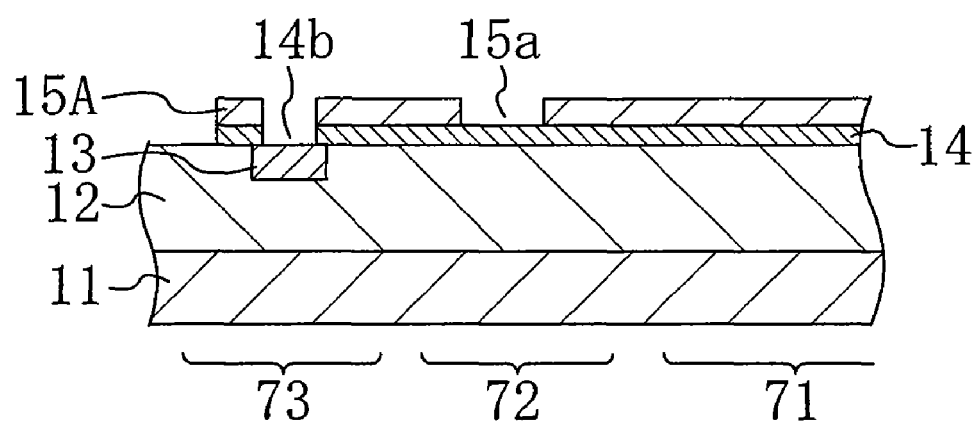
FIG. 10 is a sectional view illustrating a step of the method for manufacturing the semiconductor device according to Embodiment 2 of the present invention.

Then, as shown in FIG. 10, an opening 14a is formed in part of the lower conductive film 15A and part of the insulating film 14 corresponding to a region for forming a substrate connecting part. Then, first conductivity type impurities are implanted in part of the well 12 exposed in the opening 14b to form a first conductivity type diffusion layer 13. The impurity implantation may be performed at a concentration of, for example, $2 \times 10^{15}$ $cm^{-2}$. Further, an opening 15a is formed in part of the lower conductive film 15A corresponding to a region for forming a fuse structure 31. The openings 14b and 15a may be formed simultaneously. In the step of forming the opening 15a, the removal of the insulating film 14 may be performed at the same time. There is no problem even if the first conductivity type impurities are also implanted in part of the well 12 exposed in the opening 15a.

Figure 11:
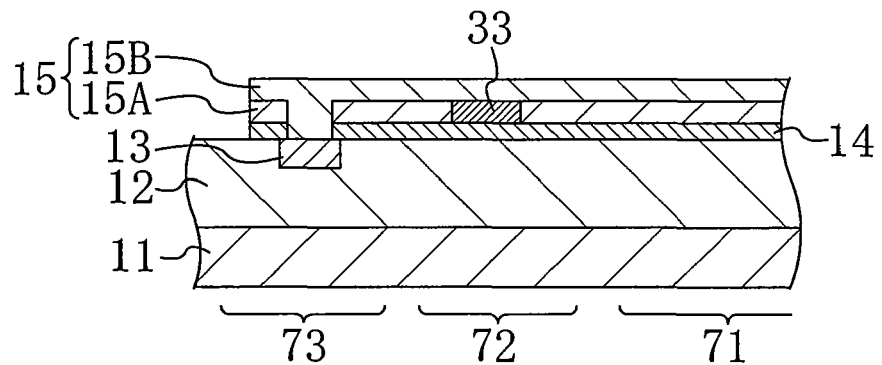
FIG. 11 is a sectional view illustrating a step of the method for manufacturing the semiconductor device according to Embodiment 2 of the present invention.

Then, as shown in FIG. 11, a fuse insulating film 33 is formed to fill the opening 15a and an upper conductive film 15B is formed on the lower conductive film 15A to fill the opening 14b. Subsequently, second conductivity type impurities are implanted in the conductive film 15. The impurity implantation may be performed at a concentration of, for example, $6 \times 10^{15}$ $cm^{-2}$. Thus, a protection target element electrode 22 of the protection target element 21, a fuse film 32 of the fuse structure 31 and a substrate connecting electrode 42 of the substrate connecting part 41 are formed in the conductive film 15. From this point of time, the protection target element electrode 22 of the protection target element and a gate insulating film (not shown) are protected from a charge-up phenomenon.

Part of the conductive film 15 serving as the fuse film 32 may be formed narrower than the other parts so that the fuse film 32 is easily torn. The narrowing may be achieved by lithography and ion milling such as RIE, FIB or other techniques.

For improved conductivity, the conductive film 15 may be metal silicide. In this case, part of the conductive film 15 to be the fuse film 32 is not silicided to increase the resistance, so that the fuse film 32 is easily torn.

Further, an insulating film as thin as 4 nm or less made of a natural oxide film or a chemical oxide film may be formed at the interface between the substrate connecting electrode 42 and the first conductivity type diffusion layer 13. With such a small thickness, the insulating film allows a sufficient tunnel current to flow or the insulating film is broken when charging occurs during a manufacturing step, thereby bringing the substrate connecting electrode 42 and the semiconductor substrate 11 into electrical connection. Therefore, the insulating film does not cause any operational problem.

Figure 12:
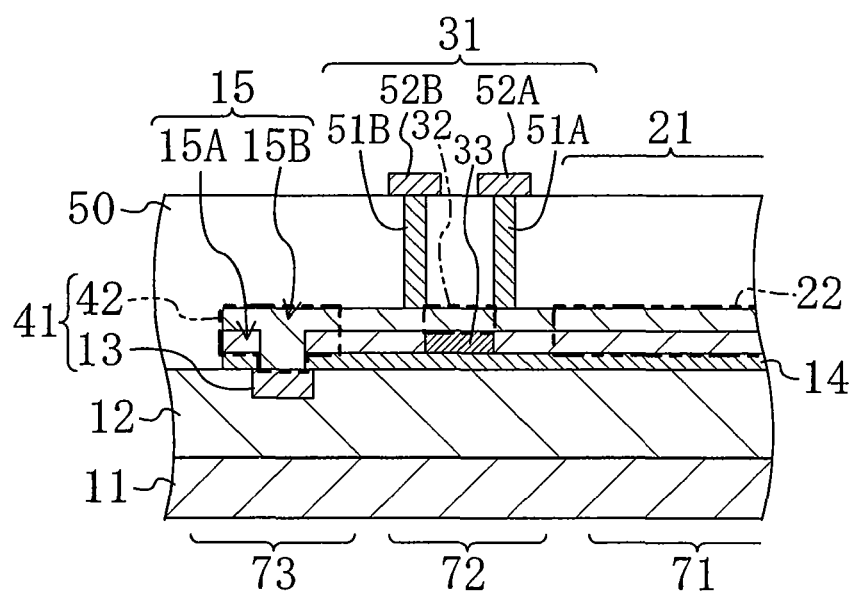
FIG. 12 is a sectional view illustrating a step of the method for manufacturing the semiconductor device according to Embodiment 2 of the present invention.

Then, after the process of finishing the protection target element including the diffusion process and other processes, a wiring layer is formed as shown in FIG. 12. Then, a first wiring line 51A and a first disconnecting terminal 52A electrically connected to one of the sides of the fuse film 32 of the conductive film 15 are formed, while a second wiring line 51B and a second disconnecting terminal 52B electrically connected to the other side of the fuse film 32 are formed. The process of finishing the protection target element may be performed simultaneously with the process of forming the wiring 50, or a process of forming the first wiring line 51A, the first disconnecting terminal 52A, the second wiring line 51B and the second disconnecting terminal 52B.

Figure 13:
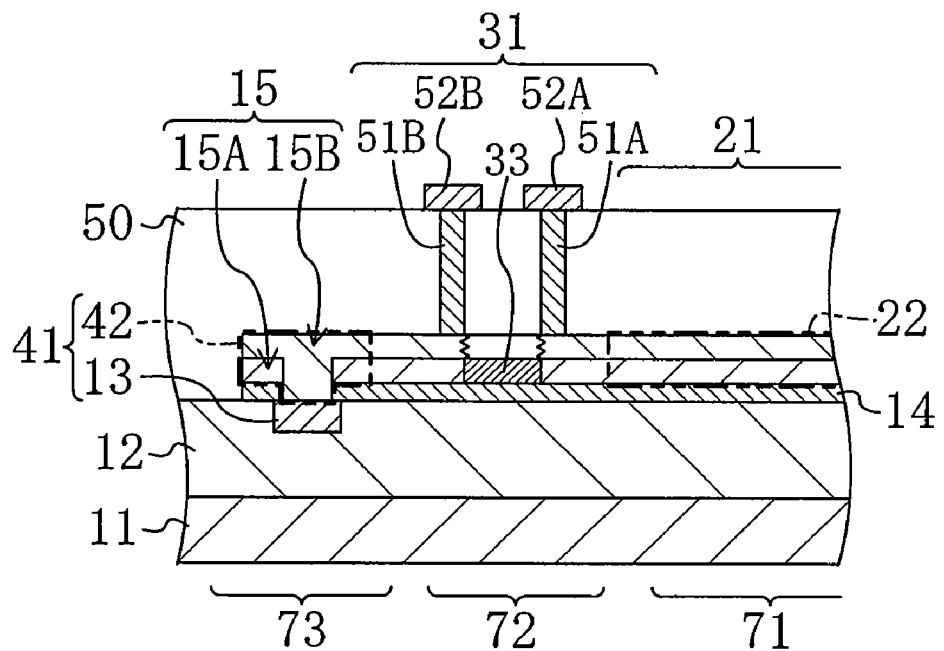
FIG. 13 is a sectional view illustrating a step of the method for manufacturing the semiconductor device according to Embodiment 2 of the present invention.
Figure 14:
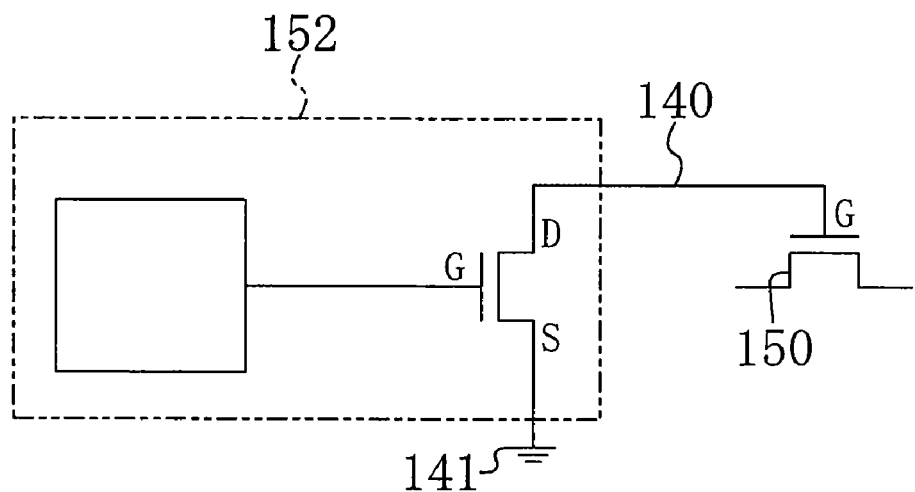
FIG. 14 is a circuit diagram illustrating a conventional protection circuit for a semiconductor element.

Then, as shown in FIG. 13, in an inspection process after the diffusion process, a current is allowed to flow between the first disconnecting terminal 52A and the second disconnecting terminal 52B to tear the fuse film 32. As a result, the protection target element electrode 22 and the substrate connecting electrode 42 are insulated from each other. For example, if the fuse film 32 is made of polysilicon doped with impurities of $6 \times 10^{15}$ $cm^{-2}$ and has a thickness of 0.1 μm, a width of 0.12 μm, a length of 0.96 μm and a sheet resistance of 260Ω/□, a current having a current density of 200 $mA/\mu m^2$ is applied to the fuse film 32 for about 0.7 msec, thereby tearing the fuse film 32. The semiconductor device of Embodiment 2 makes it possible to reduce the thickness of only part of the conductive film serving as the fuse film 32 to increase the resistance. Therefore, as compared with the semiconductor device of Embodiment 1, the fuse film 32 is torn more easily.

Also in the case where the semiconductor device of the present embodiment is configured to have a plurality of protection target elements, size reduction of the device is achieved as long as the layout shown in FIG. 7 is adopted.

As the protection target element according to the above-described embodiments, usable are nonvolatile memories such as MONOS (metal-oxide-nitride-oxide-silicon) memories and floating gate (FG) memories, and volatile memories such as static random access memories (SRAM) and dynamic random access memories (DRAM).

According to the semiconductor device and the method for manufacturing the same of the present invention described above, is realized a semiconductor device capable of protecting a protection target element from a charge-up phenomenon during a diffusion process on the FEOL level even at low positive and negative voltages and applying high positive and negative voltages required for driving the protection target element to the protection target element after the completion of the diffusion process. In particular, the semiconductor device and the method for manufacturing the same of the present invention are useful as a semiconductor memory, such as a memory device which is disadvantageously affected by a charge-up phenomenon during a diffusion process, and a method for manufacturing the same.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:
a protection target element formed on a semiconductor substrate and includes a protection target element electrode;
a substrate connecting part including a substrate connecting electrode electrically connected to the semiconductor substrate; and
a fuse structure provided between the protection target element electrode and the substrate connecting electrode and includes a fuse film configured to be torn by applying a predetermined current thereto, wherein
the protection target element electrode, the substrate connecting electrode and the fuse film are formed of an integral conductive film as long as the fuse film is not torn.

2. The semiconductor device of claim 1, wherein
the fuse film is torn and
the protection target element electrode and the substrate connecting electrode in the conductive film are insulated from each other.

3. The semiconductor device of claim 1, further comprising an insulating film provided between the conductive film and the semiconductor substrate.

4. The semiconductor device of claim 1, wherein
the fuse structure includes a first disconnecting terminal and a second disconnecting terminal electrically connected to parts of the conductive film on the sides of the fuse film, respectively.

5. The semiconductor device of claim 1, wherein
part of the semiconductor substrate connected to the substrate connecting electrode has a first conductivity and
the substrate connecting electrode has a second conductivity.

6. The semiconductor device of claim 5, wherein
the substrate connecting part includes a first conductivity type diffusion layer formed in part of the semiconductor substrate connected to the substrate connecting electrode.

7. The semiconductor device of claim 6, wherein
the semiconductor substrate includes a first conductive type well and the first conductivity type diffusion layer is formed in the first conductivity type well.

8. The semiconductor device of claim 1, wherein
the substrate connecting electrode is connected to the semiconductor substrate with the interposition of a substrate connecting insulating film having a thickness of 4 nm or less.

9. The semiconductor device of claim 1, wherein
the protection target element is a nonvolatile memory whose characteristic varies depending on electrons or holes stored in and removed from a charge storage layer.

10. The semiconductor device of claim 1, wherein
the fuse film has a width smaller than the width of the protection target element electrode and the width of the substrate connecting electrode.

11. The semiconductor device of claim 1, wherein
a plurality of the conductive films are arranged in parallel at intervals,
the fuse film and the substrate connecting electrode of one conductive film are formed on one of the sides of the corresponding protection target element electrode, while the fuse film and the substrate connecting electrode of another conductive film adjacent to said conductive film are formed on the other side of the corresponding protection target element electrode and
parts of the conductive film on the sides of each fuse film have a width larger than the width of the protection target element electrode.

12. The semiconductor device of claim 1, wherein
the conductive film is metal silicide except part thereof corresponding to the fuse film.

13. The semiconductor device of claim 1, wherein
the conductive film includes a lower conductive film and an upper conductive film except part thereof corresponding to the fuse film and
the fuse film is made of the upper conductive film formed on a fuse insulating film.

14. The semiconductor device of claim 13, wherein
the upper conductive film in the substrate connecting electrode is connected to the substrate.

* * * * *